(12) United States Patent
Zhang et al.

(10) Patent No.: US 9,443,946 B2
(45) Date of Patent: Sep. 13, 2016

(54) METHOD OF MANUFACTURING AN EMBEDDED SPLIT-GATE FLASH MEMORY DEVICE

(71) Applicant: Semiconductor Manufacturing International (Shanghai) Corporation, Shanghai (CN)

(72) Inventors: Liqun Zhang, Beijing (CN); Huilin Ma, Beijing (CN); Jing Zhang, Beijing (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/597,104

(22) Filed: Jan. 14, 2015

(65) Prior Publication Data
US 2015/0295056 A1   Oct. 15, 2015

(30) Foreign Application Priority Data
Apr. 10, 2014 (CN) .......................... 2014 1 0141213

(51) Int. Cl.
| | | |
|---|---|---|
| *H01L 21/28* | (2006.01) | |
| *H01L 27/105* | (2006.01) | |
| *H01L 29/423* | (2006.01) | |
| *H01L 29/66* | (2006.01) | |
| *H01L 27/115* | (2006.01) | |

(52) U.S. Cl.
CPC ... *H01L 29/42328* (2013.01); *H01L 21/28273* (2013.01); *H01L 27/11521* (2013.01); *H01L 27/11541* (2013.01); *H01L 29/66825* (2013.01)

(58) Field of Classification Search
None
See application file for complete search history.

(56) References Cited

U.S. PATENT DOCUMENTS

| | | | |
|---|---|---|---|
| 6,358,816 B1 * | 3/2002 | Singh et al. | 438/424 |
| 6,420,232 B1 * | 7/2002 | Wu | 438/257 |
| 2002/0008293 A1 * | 1/2002 | Kuroi et al. | 257/412 |
| 2004/0169219 A1 * | 9/2004 | Miida et al. | 257/321 |

* cited by examiner

*Primary Examiner* — Johannes P Mondt
(74) *Attorney, Agent, or Firm* — Innovation Counsel LLP

(57) ABSTRACT

A method of manufacturing an embedded split-gate flash memory device is provided. The method includes: performing shallow trench isolation and chemical mechanical planarization on a semiconductor substrate comprising a flash memory region and a logic region, wherein a first oxide is formed on the semiconductor substrate and a first nitride is formed on the first oxide; forming a first photoresist over the logic region, and removing the first nitride disposed in the flash memory region; removing the first photoresist, and depositing a floating gate polysilicon material over the semiconductor substrate; performing chemical mechanical planarization on the floating gate polysilicon material; forming a control gate in the flash memory region; etching the floating gate polysilicon material to form a floating gate; forming a second photoresist over the flash memory region, and removing the first oxide and the first nitride disposed in the logic region; and removing the second photoresist.

13 Claims, 5 Drawing Sheets

METHOD OF MANUFACTURING AN EMBEDDED SPLIT-GATE FLASH MEMORY DEVICE

CROSS-REFERENCE TO RELATED APPLICATION

This application claims priority to Chinese Patent Application No. 201410141213.6 filed on Apr. 10, 2014, the disclosure of which is incorporated herein by reference in its entirety.

BACKGROUND

1. Technical Field

The present disclosure generally relates to the field of semiconductors, and more particularly to method of manufacturing an embedded split-gate flash memory device.

2. Description of the Related Art

Embedded split-gate flash memory devices are commonly used in integrated circuits. An embedded split-gate flash memory device may include a semiconductor substrate comprising a flash memory region and a logic region, a silicon oxide layer formed on the flash memory region, a floating gate formed on the silicon oxide layer, an insulating layer formed on the floating gate, and a control gate formed on the insulating layer. The floating gate may be formed of polysilicon.

An embedded split-gate flash memory is a type of voltage-controlled device, and its write/erase functions are based on tunneling effect. Specifically, current in the embedded split-gate flash memory flows through the silicon oxide layer between the floating gate and the semiconductor substrate. The floating gate is then charged so as to write data, or discharged so as to erase data.

Presently, in most embedded split-gate flash memory manufacturing process flows, the floating gate polysilicon is deposited after shallow trench isolation (STI) formation. Chemical-Mechanical Polishing (CMP) is then performed to planarize the floating gate polysilicon in both the logic region and the flash memory region. However, it is often difficult to achieve CMP uniformity due to the difference in pattern density between the logic region and the flash memory region. After CMP on the floating gate polysilicon has been completed, deposition and etch processes are then carded out to form the control gate and floating gate and corresponding sidewalls. However, since the floating gate polysilicon in the logic region is much thicker than the floating gate polysilicon in the flash memory region (due to uneven CMP), numerous cone defects may be generated after the etch processes. As a result, the non-uniformity in the CMP process and the etch defects may lead to manufacturing yield losses.

SUMMARY

The present disclosure addresses at least the above problems relating to CMP non-uniformity and etch defects in the manufacture of an embedded split-gate flash memory device.

According to one embodiment of the inventive concept, a method of manufacturing an embedded split-gate flash memory device is provided. The method includes: performing shallow trench isolation and chemical mechanical planarization on a semiconductor substrate comprising a flash memory region and a logic region, wherein a first oxide is formed on the semiconductor substrate and a first nitride is formed on the first oxide; forming a first photoresist over the logic region, and removing the first nitride disposed in the flash memory region; removing the first photoresist from the logic region, and depositing a floating gate polysilicon material over the semiconductor substrate; performing chemical mechanical planarization on the floating gate polysilicon material; sequentially depositing an insulating layer, a control gate polysilicon layer, and an additional layer on the floating gate polysilicon material, and performing photolithography to form a control gate in the flash memory region; etching the floating gate polysilicon material to form a floating gate; forming a second photoresist over the flash memory region, and removing the first oxide and the first nitride disposed in the logic region; and removing the second photoresist from the flash memory region.

In some embodiments, the first nitride disposed in the flash memory region may be removed using a selective etchant.

In some embodiments, the selective etchant may be a phosphoric acid solution.

In some embodiments, the control gate may include the insulating layer, the control gate polysilicon layer, and the additional layer remaining after the photolithography.

In some embodiments, etching the floating gate polysilicon material to form the floating gate may further include: depositing and etching an insulating material to form a sidewall; and etching a portion of the sidewalls at a word line side before etching the floating gate polysilicon material.

In some embodiments, performing photolithography to form the control gate in the flash memory region may further include: forming a control gate group, wherein the control gate group comprises a first control gate and a second control gate each having a same structure, and wherein each of the first and second control gates includes the insulating layer, the control gate polysilicon layer, and the additional layer.

In some embodiments, etching the floating gate polysilicon material to form the floating gate may further include: depositing and etching an insulating material to form laterally opposite sidewalls on each of the first and second control gates; forming a third photoresist to protect an erase region, wherein the erase region corresponds to a region bounded between the sidewalls first and second control gates; etching a portion of the sidewall at word line side such that a left sidewall of the first control gate and a right sidewall of the second control gate are etched; etching the floating gate polysilicon material to form the floating gate; and removing the third photoresist from the erase region.

In some embodiments, the first and second control gates may share the erase region such that the erase region is disposed between the first and second control gates.

In some embodiments, the insulating material may include an oxide, a nitride, or a combination of oxides and nitrides.

In some embodiments, the insulating material may include a second oxide, a second nitride, and a third oxide that are sequentially deposited and etched using a self-alignment process to form an ONO (oxide-nitride-oxide) sidewall structure.

In some embodiments, sequentially depositing the insulating layer, the control gate polysilicon layer, and the additional layer on the floating gate polysilicon material, and performing photolithography to form the control gate in the flash memory region may further include: sequentially depositing the insulating layer, the control gate polysilicon layer, a control gate TEOS (Tetraethyl Orthosilicate) hard mask layer, a control gate silicon nitride hard mask layer, a buffer control gate oxide hard mask layer, an amorphous carbon layer, and applying a third photoresist on the amorphous carbon layer; performing photolithography on the third photoresist, and forming the control gate by etching the sequentially deposited layers; and removing the third photoresist, the amorphous carbon layer, and the buffer control gate oxide hard mask layer.

In some embodiments, sequentially depositing the insulating layer, the control gate polysilicon layer, and the additional layer on the floating gate polysilicon material, and performing photolithography to form the control gate in the flash memory region may further include: sequentially depositing the insulating layer, the control gate polysilicon layer, a control gate TEOS (Tetraethyl Orthosilicate) hard mask layer, a control gate silicon nitride hard mask layer, a buffer control gate oxide hard mask layer, an amorphous carbon layer, and applying a third photoresist on the amorphous carbon layer; performing photolithography on the third photoresist, and forming the first and second control gates by etching the sequentially deposited layers; and removing the third photoresist, the amorphous carbon layer, and the buffer control gate oxide hard mask layer.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1:
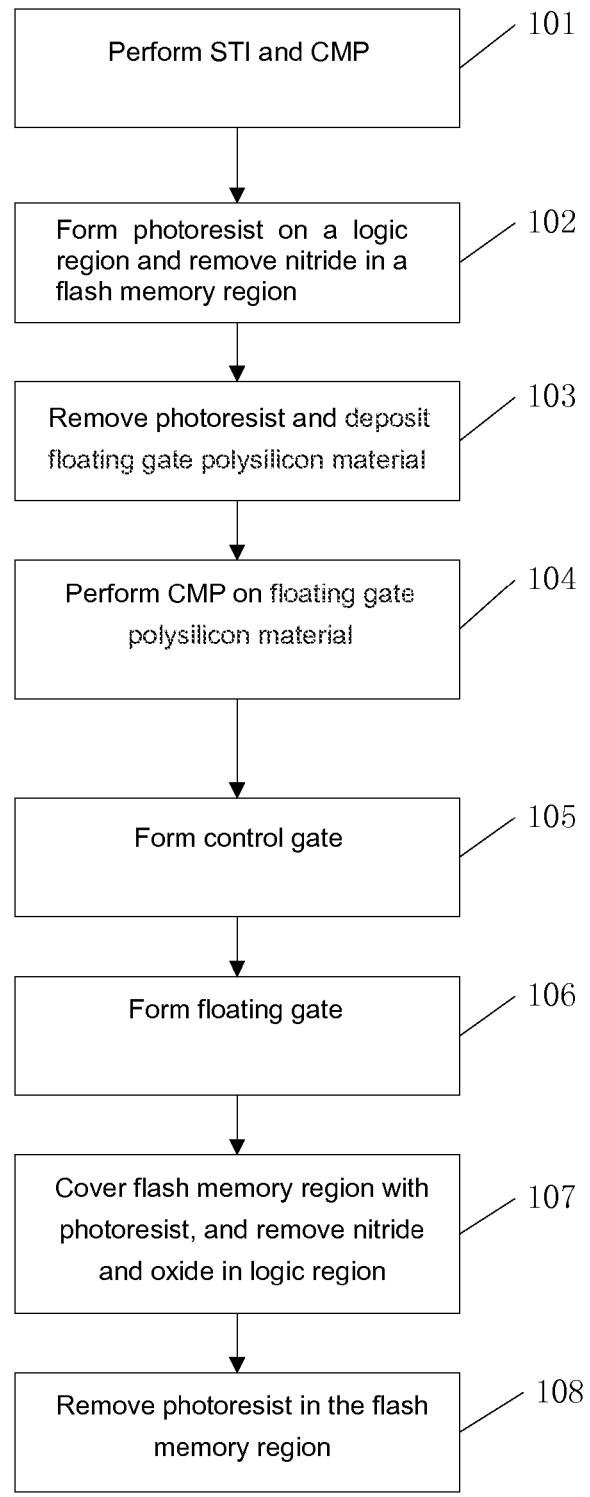
FIG. 1 is a flowchart illustrating an exemplary method of manufacturing an embedded split-gate flash memory device according to an embodiment of the inventive concept.

Various embodiments of the inventive concept are next described with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that the inventive concept is not limited to the embodiments described herein. Rather, the inventive concept may be modified in different ways to realize different embodiments.

FIG. 1 is a flowchart illustrating an exemplary method of manufacturing an embedded split-gate flash memory device according to an embodiment of the inventive concept. FIGS. 2A-2J are schematic cross-sectional views of the embedded split-gate flash memory device of FIG. 1 at different stages of manufacture.

Figure 2A:
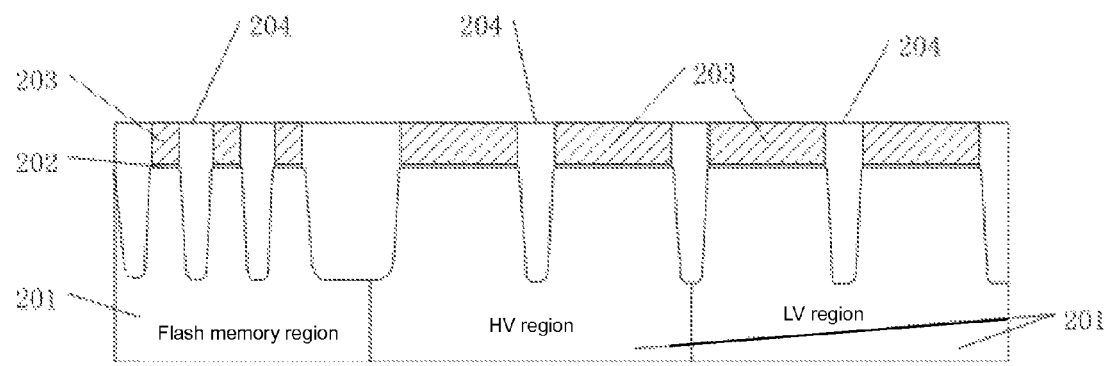
FIGS. 2A-2J are schematic cross-sectional views of the embedded split-gate flash memory device of FIG. 1 at different stages of manufacture.

Referring to Step 101 of FIG. 1, shallow trench isolation (STI) and chemical mechanical planarization (CMP) are performed to produce the device structure illustrated in FIG. 2A. The device structure includes a semiconductor substrate 201 comprising a flash memory region and a logic region, an oxide 202 (e.g. silicon oxide) formed on the semiconductor substrate 201, and a nitride 203 (e.g. silicon nitride) formed on the oxide 202.

The flash memory region (also referred to as a memory cell) of the semiconductor substrate 201 has a high pattern density, whereas the logic region of the semiconductor substrate 201 has a low pattern density. The logic region further includes a high voltage (HV) region and a low voltage (LV) region. In some embodiments, the turn-on voltage for device operation in the logic region includes a high threshold voltage of 2.5V and a low threshold voltage of 1.2V.

In one embodiment, the semiconductor substrate 201 may be silicon. The inventive concept will be described using a silicon semiconductor substrate 201 as an example. However, the inventive concept is not limited thereto, and it should be noted that the substrate 201 may include other semiconductor materials.

An oxide 204 (e.g. silicon oxide) may be formed in the shallow trenches. As shown in FIG. 2A, the nitride 203 may be disposed between adjacent trenches.

In one embodiment, the shallow trench isolation (STI) and chemical mechanical planarization (CMP) processes may include:

1) Rinsing and drying a silicon wafer (e.g. semiconductor substrate 201), and performing high-temperature oxidation of the silicon wafer to form a silicon oxide layer;

2) Forming a silicon nitride layer on the wafer (for example, by placing the wafer into a low pressure vapor deposition apparatus in which dichlorosilane and ammonia react to form a thin layer of silicon nitride);

3) Performing lithography, whereby the areas (of the silicon oxide and nitride layers) that are not protected by the photolithographic mask are etched using dry etching or wet etching, so as to form the oxide 202 and nitride 203;

4) forming an oxide liner (e.g. silicon oxide liner) on the sidewalls of the trenches;

5) filling the trenches with the oxide 204 (e.g. silicon oxide) using chemical vapor deposition (CVD); and 6) performing chemical mechanical planarization (CMP) on the filled trench so as to planarize the oxide 204, whereby the silicon nitride 203 (which is harder than the silicon oxide 204) serves as a polishing stop to prevent the trench isolation structures from being completely removed by the CMP process.

Figure 2B:
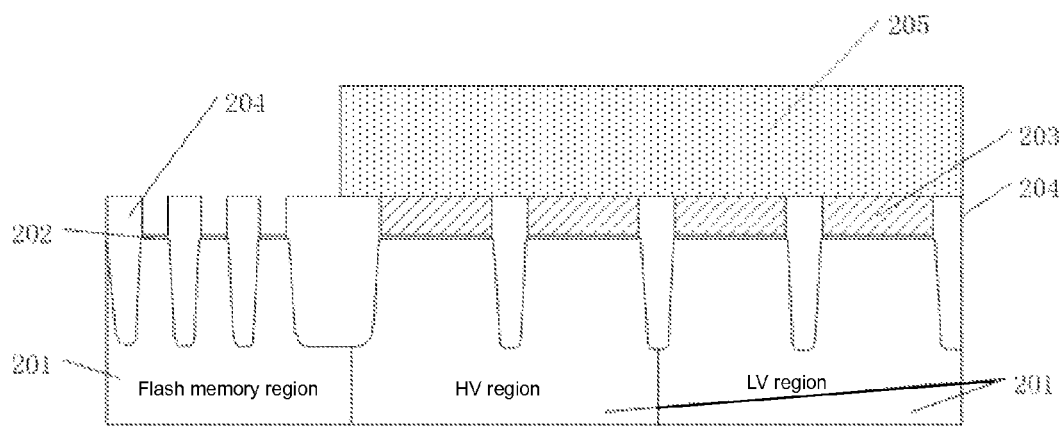

Referring to Step 102 of FIG. 1, a photoresist layer 205 is formed on the logic region of the semiconductor substrate 201, and the nitride 203 is then removed using the photoresist layer 205 as a mask, with the resulting structure shown in FIG. 2B. Specifically, the nitride 203 in the logic region is protected by the photoresist layer 205, whereas the nitride 203 in the flash memory region is selectively removed using an etching solution. In particular, the etching solution selectively etches nitride while leaving other materials (such as the oxide 204 in the trenches) intact. In one embodiment, the etching solution may be phosphoric acid.

Figure 2C:
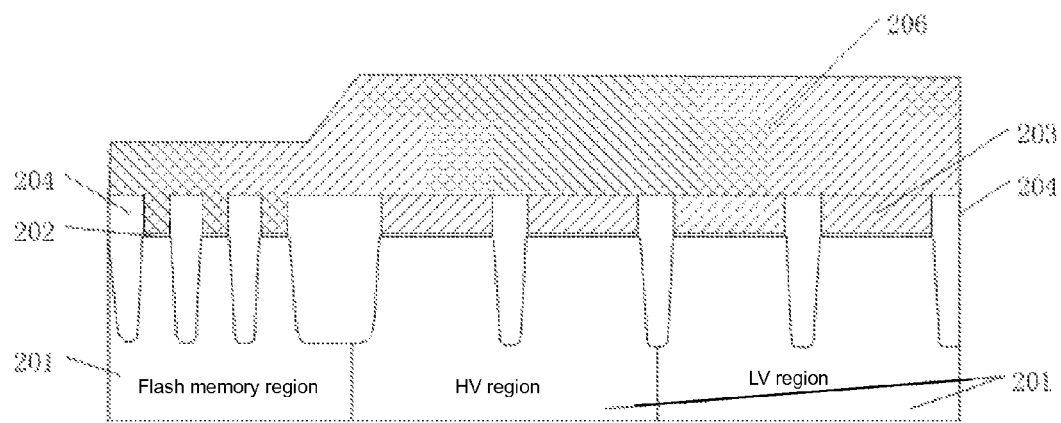

Referring to Step 103 of FIG. 1, the photoresist layer 205 in the logic region of the semiconductor substrate 201 is removed, and a floating gate polysilicon material 206 is deposited over the semiconductor substrate 201, with the resulting structure shown in FIG. 2C.

In one embodiment, after the photoresist layer 205 in the logic region is removed, the floating gate polysilicon material 206 is deposited on the flash memory region and the logic region using, for example, high-temperature deposition techniques. Referring to FIG. 2C, the thickness of the floating gate polysilicon material 206 is greater than the thickness of the nitride 203 (after the CMP in Step 101), so as to completely fill the isolation trench in the flash memory region (after the nitride 203 in the flash memory region has been removed). In one embodiment, the high-temperature deposition techniques may be implemented using a high temperature furnace. In one embodiment, the temperature of the furnace may be at least 780° C. In another embodiment, the temperature of the furnace may be greater than 1000° C. However, it should be noted that the inventive concept is not limited to the aforementioned temperature limits.

As shown in FIG. 2C, the floating gate polysilicon material 206 may have an uneven top surface due to the different underlying topography between the flash memory region and the logic region.

Figure 2D:
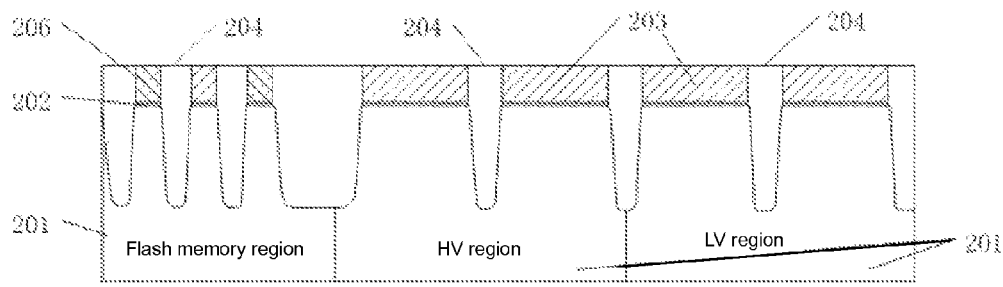

Referring to Step 104 of FIG. 1, chemical mechanical planarization (CMP) is performed on the floating gate polysilicon material 206 to planarize its top surface, with the resulting structure shown in FIG. 2D.

In a conventional CMP apparatus, the CMP includes dispensing a slurry between the semiconductor surface and the polishing head, and planarizing the semiconductor surface by applying a pressure and polishing relative motion between the semiconductor surface and the polishing head.

However, for the CMP of the floating gate polysilicon material 206, the slurry that is being used has little effect on the nitride 203 but is highly selective towards the floating gate polysilicon material 206. As a result, the nitride 203 in the logic region can serve as a barrier (polishing stop) layer. Accordingly, the CMP of the logic region may be integrated into the CMP of the floating gate polysilicon material 206, thereby reducing the number of CMP process steps.

It should be noted that FIG. 2D illustrates the optimal structure after CMP on the flash memory region and the logic region has been completed. As previously described in the Background section, different pattern densities may result in different CMP rates, whereby the CMP rate is typically higher in a higher density area than a lower density area. The flash memory region typically has a higher pattern density compared to the logic region. However, the CMP slurry according to the inventive concept is highly selective, and therefore the nitride and STI oxide in logic region and STI oxide in the flash region is almost not polished by the CMP, while the polysilicon in the flash region has an uniform pattern density. As a result, CMP uniformity can be achieved using the CMP process according to the inventive concept.

Referring to Step 105 of FIG. 1, an insulating layer, a control gate polysilicon layer, and an additional layer are sequentially deposited on the floating gate polysilicon material 206 after the CMP, and etched after photolithography to form a control gate in the flash memory region.

Figure 2E:
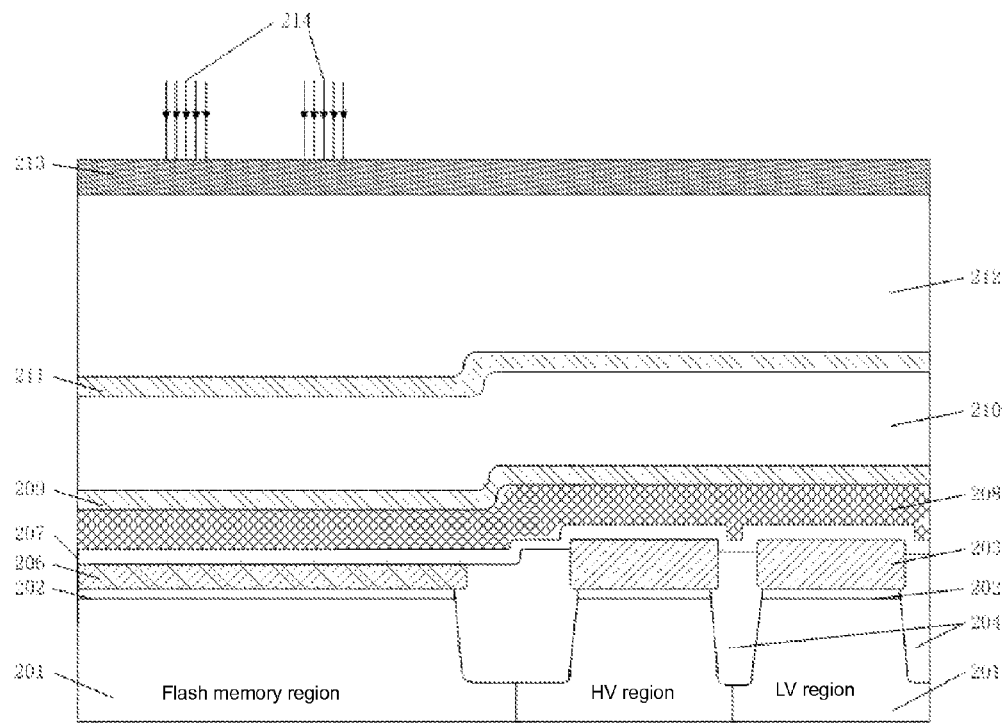
Figure 2F:
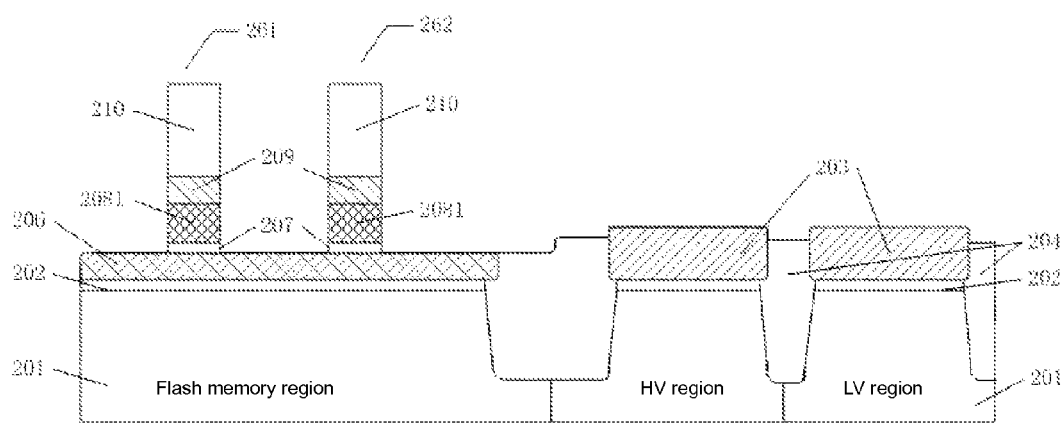

In one embodiment, sequentially depositing the insulating layer, the control gate polysilicon layer, and the additional layer, and etching the layers after photolithography to form the control gate in the flash memory region may include:

1) sequentially depositing an insulating layer 207 (e.g. an oxide layer), a control gate polysilicon (CG Poly) layer 208, a control gate TEOS (Tetraethyl Orthosilicate) hard mask (CG HM TEOS) layer 209, a control gate silicon nitride hard mask (CG HM SiN) layer 210, a buffer control gate oxide hard mask (CG HM Buffer Ox) layer 211 (e.g. silicon oxide), an amorphous carbon (α-Carbon) layer 212, and applying a photoresist 213 on the amorphous carbon layer 212 (for example, as shown in FIG. 2E);

2) performing photolithography using light rays 214, and forming a control gate 2081 (see FIG. 2F) through etching and other appropriate processes; and 3) removing the photoresist 213, the amorphous carbon layer 212, and the buffer control gate oxide hard mask layer 211, thereby producing the structure shown in FIG. 2F.

Referring to FIG. 2F, the CG HM TEOS layer 209 and the CG HM SiN layer 210 collectively constitute the additional layer. In some embodiments, the amorphous carbon layer 212 may be removed by oxygen plasma, and the CG HM Buffer Ox layer 211 may be etched away.

In one embodiment, the insulating layer 207, the CG Poly layer 208, the CG HM TEOS layer 209, and the CG HM SiN layer 210 may be sequentially formed on the floating gate polysilicon material 206 using a combination of chemical vapor deposition (CVD), photolithography, etching, and other processes. FIG. 2E illustrates photolithography being performed on an exemplary split-gate flash memory device to form the control gate 2081. It should be noted that the viewing direction of the flash region in FIG. 2E is perpendicular to the viewing direction of the flash region in FIG. 2D, whereas the viewing directions of the logic region in FIGS. 2D and 2E are the same.

The CG HM TEOS layer 209 and the CG HM SiN layer 210 serve to increase the height of the split-gate flash memory device. Additionally, the CG HM TEOS layer 209 functions as an adhesion layer. The CG HM Buffer Ox buffer layer 211 serves as an etch stop layer. The amorphous carbon layer 212 protects the underlying CG HM SiN layer 210, CG HM TEOS layer 209, and CG Poly layer 208 from damage caused by excessive etching.

In one embodiment, referring to FIG. 2E, the floating gate polysilicon material 206 may have a thickness of about 1200~2000 Å; the insulating layer 207 may have a thickness of about several tens of angstroms (for example, 50~100 Å); the CG Poly layer 208 may have a thickness of about 300~600 Å; the CG HM TEOS layer 209 may have a thickness of several tens of angstroms (for example, 50~100 Å) the CG HM SiN layer 210 may have a thickness of about 500~3000 Å; the CG HM Buffer Ox buffer layer 211 may have a thickness of about 100~200 Å; the amorphous carbon layer 212 may have a thickness of about 3000~8000 Å; and the photoresist 213 may have a thickness of about 2000~5000 Å. It should be noted that the above thickness values are merely exemplary, and should not be construed as limiting the inventive concept.

Figure 2G:
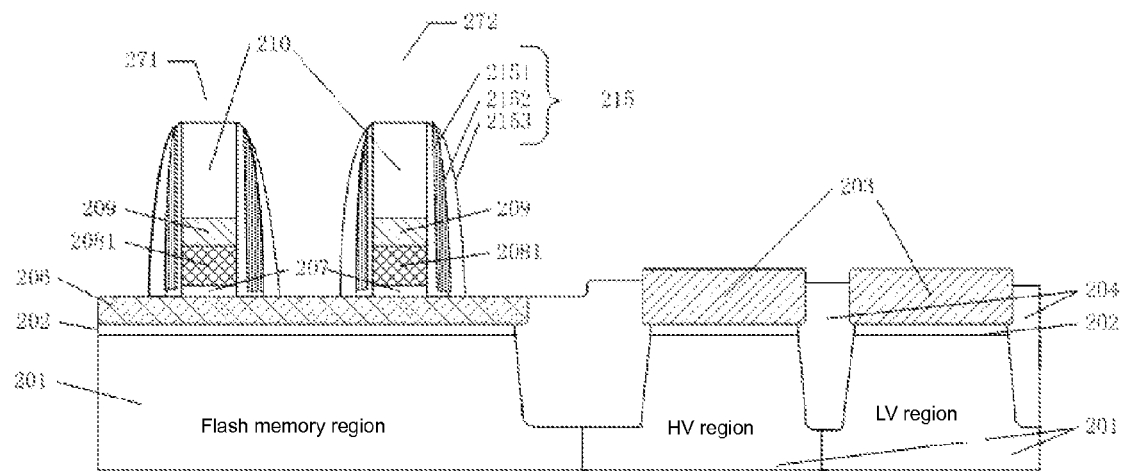
Figure 2H:
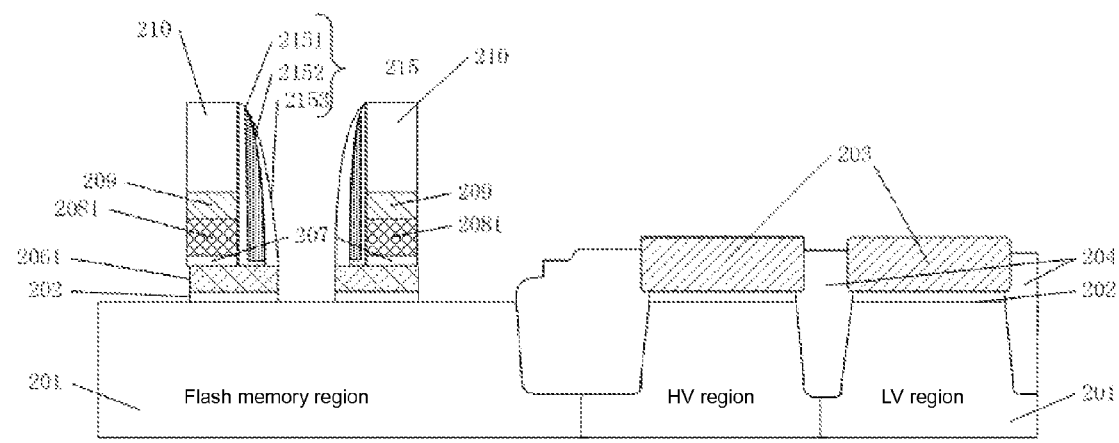

Referring to Step 106 of FIG. 1, the floating gate polysilicon material 206 is etched to form a floating gate 2061, with the resulting structure shown in FIG. 2H.

In one embodiment, forming the control gate in the flash memory region may include forming a control gate comprising an insulating layer, a control gate layer, and an additional layer. Also, etching the floating gate polysilicon material 206 may include depositing and etching an insulating material to form sidewalls 215, and etching a portion of the sidewalls 215 at a word line side. For example, the floating gate polysilicon material 206 may be etched using wet etching techniques and a mask. The sidewall 215 can reduce interference between flash devices in adjacent flash memory regions.

In another embodiment (for example, as shown in FIGS. 2F and 2G), forming the control gate in the flash memory region may include forming a control gate group. The control gate group may include two control gates (for example, a control gate 271 and a control gate 272) each having the same structure. Each control gate further includes an insulating layer 207, a control gate 2081, and an additional layer.

In one embodiment, etching the floating gate polysilicon material 206 may include depositing and etching an insulating material to form laterally opposite sidewalls 215 on the control gates; and protecting an erase region using a photoresist. The erase region refers to a region bounded between the sidewalls of adjacent control gates (for example, the region bounded between the sidewalls 215 of the control gates 271 and 272 shown in FIG. 2G). A portion of the sidewalls at a word line side is etched (for example, referring to FIGS. 2G and 2H, the left sidewall of the control gate 271 and the right sidewall of the control gate 272 are etched). Next, the floating gate polysilicon material 206 is etched using, for example, dry etching. Specifically, the photoresist is removed, and the floating gate polysilicon material 206 in the erase region is etched so as to form the floating gate 2061.

In one embodiment, the control gate group may share a common erase region, which helps to save space (thereby allowing more devices to be fabricated per unit area).

In one embodiment, the insulating material 215 may be an oxide, a nitride, or a combination of oxides and nitrides.

In one embodiment, the insulating material 215 may be a combination of oxides and nitrides, whereby an oxide layer 2151, a nitride layer 2152, and an oxide layer 2153 are sequentially deposited, and etched using a self-alignment process to form an ONO (oxide-nitride-oxide) sidewall structure.

Figure 2I:
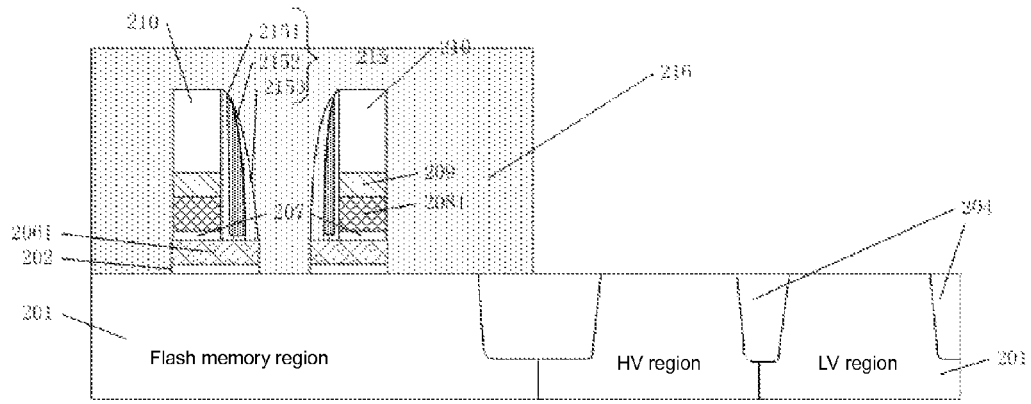

Referring to Step 107 of FIG. 1, the flash memory region is covered with a photoresist 216, and the nitride 203 and the silicon oxide 202 in the logic region are then removed, with the resulting structure shown in FIG. 2I.

In one embodiment, the photoresist 216 is formed covering the flash memory region so as to protect the flash memory region. Next, the nitride 203 in the logic region is removed using a selective wet etchant, and the oxide 202 in the logic region may also be removed using another selective wet etchant. In practice, however, the oxide 202 may not be completely removed by the wet etchant due to different etch selectivity between the oxide and the nitride. Nevertheless, in some instances, the remaining oxide 202 can help to protect the logic region of the semiconductor substrate 201. In one embodiment, the selective wet etchant may be phosphoric acid, but the inventive concept is not limited thereto.

Figure 2J:
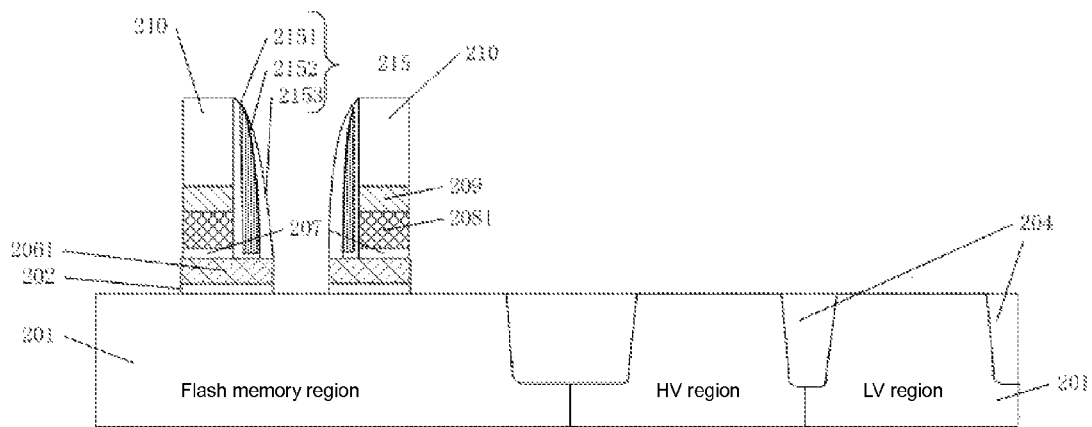

Referring to Step 108 of FIG. 1, the photoresist 216 in the flash memory region is removed, with the resulting structure shown in FIG. 2J.

In one embodiment, the photoresist 216 in the flash memory region may be removed using a wet lift-off technique. In an alternative embodiment, the photoresist 216 may be ashed, and then completely removed using a wet stripping technique.

According to one embodiment of the inventive concept, a process for manufacturing an embedded split-gate flash memory device includes forming a control gate first, and subsequently forming a floating gate. Accordingly, the process for manufacturing the embedded split-gate flash memory device can be simplified (compared to conventional processes for manufacturing an embedded split-gate flash memory device).

As previously described in the Background section, in conventional manufacturing processes for embedded split-gate flash memory devices, it is often necessary to form the logic region before forming the flash memory region. However, the thickness of the polysilicon floating gate is usually greater in the logic region than in the flash memory region due to different pattern densities. As a result, during the formation of the flash memory region, the logic region is subject to further etching that may generate numerous defects (such as cones). The defects may affect the electrical performance of the devices in the logic region and lead to yield losses.

In contrast, according to the inventive concept, the logic region is not etched during the formation of the flash floating gate. As a result, the polysillicon is being etched is less. Accordingly, the associated cone defects can be reduced using the above embodiments of the inventive concept. Accordingly, the performance and quality of a semiconductor device manufactured using the method of the inventive concept can be improved.

Embodiments of a semiconductor device and methods of manufacturing the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A method of manufacturing an embedded split-gate flash memory device, comprising:
    performing shallow trench isolation and chemical mechanical planarization on a semiconductor substrate comprising a flash memory region and a logic region, wherein a first oxide is formed on the semiconductor substrate and a first nitride is formed on the first oxide;
    forming a first photoresist over the logic region, and removing the first nitride disposed in the flash memory region;
    removing the first photoresist from the logic region, and depositing a floating gate polysilicon material over the semiconductor substrate;
    performing chemical mechanical planarization on the floating gate polysilicon material;
    sequentially depositing an insulating layer, a control gate polysilicon layer, and an additional layer on the floating gate polysilicon material, and performing photolithography to form a control gate in the flash memory region;
    etching the floating gate polysilicon material to form a floating gate by depositing and etching an insulating material to form a sidewall of the control gate and etching a portion of the sidewall along a write line before etching the floating gate polysilicon material;

forming a second photoresist over the flash memory region, and removing the first oxide and the first nitride disposed in the logic region; and removing the second photoresist from the flash memory region.

2. The method according to claim 1, wherein the first nitride disposed in the flash memory region is removed using a selective etchant.

3. The method according to claim 2, wherein the selective etchant is a phosphoric acid solution.

4. The method according to claim 1, wherein the control gate comprises the insulating layer, the control gate polysilicon layer, and the additional layer remaining after the photolithography.

5. The method according to claim 1, wherein the performing of the photolithography to form the control gate in the flash memory region further comprises:

forming a control gate group, wherein the control gate group comprises a first control gate and a second control gate each having a same structure, and wherein each of the first and second control gates includes the insulating layer, the control gate polysilicon layer, and the additional layer.

6. The method according to claim 5, wherein the etching of the floating gate polysilicon material to form the floating gate further comprises:

depositing and etching an insulating material to form laterally opposite sidewalls on each of the first and second control gates;

forming a third photoresist to protect an erase region, wherein the erase region corresponds to a region bounded between the sidewalls of the first and second control gates;

etching a portion of the sidewalls along a write line such that a left sidewall of the first control gate and a right sidewall of the second control gate are etched;

etching the floating gate polysilicon material to form the floating gate; and removing the third photoresist from the erase region.

7. The method according to claim 6, wherein the first and second control gates share the erase region such that the erase region is disposed between the first and second control gates.

8. The method according to claim 1, wherein the insulating material includes an oxide, a nitride, or a combination of oxides and nitrides.

9. The method according to claim 6, wherein the insulating material includes an oxide, a nitride, or a combination of oxides and nitrides.

10. The method according to claim 8, wherein the insulating material includes a second oxide, a second nitride, and a third oxide that are sequentially deposited and etched using a self-alignment process to form an ONO (oxide-nitride-oxide) sidewall structure.

11. The method according to claim 9, wherein the insulating material includes a second oxide, a second nitride, and a third oxide that are sequentially deposited and etched using a self-alignment process to form an ONO (oxide-nitride-oxide) sidewall structure.

12. The method according to claim 4, wherein the sequentially depositing of the insulating layer, the control gate polysilicon layer, and the additional layer on the floating gate polysilicon material, and the performing of the photolithography to form the control gate in the flash memory region further comprises:

sequentially depositing the insulating layer, the control gate polysilicon layer, a control gate TEOS (Tetraethyl Orthosilicate) hard mask layer, a control gate silicon nitride hard mask layer, a buffer control gate oxide hard mask layer, an amorphous carbon layer, and applying a third photoresist on the amorphous carbon layer;

performing the photolithography on the third photoresist, and forming the control gate by etching the sequentially deposited layers; and removing the third photoresist, the amorphous carbon layer, and the buffer control gate oxide hard mask layer.

13. The method according to claim 5, wherein the sequentially depositing of the insulating layer, the control gate polysilicon layer, and the additional layer on the floating gate polysilicon material, and the performing of the photolithography to form the control gate in the flash memory region further comprises:

sequentially depositing the insulating layer, the control gate polysilicon layer, a control gate TEOS (Tetraethyl Orthosilicate) hard mask layer, a control gate silicon nitride hard mask layer, a buffer control gate oxide hard mask layer, an amorphous carbon layer, and applying a third photoresist on the amorphous carbon layer;

performing the photolithography on the third photoresist, and forming the first and second control gates by etching the sequentially deposited layers; and removing the third photoresist, the amorphous carbon layer, and the buffer control gate oxide hard mask layer.

* * * * *